United States Patent [19]
Copeland, III

[11] B  3,982,141
[45] Sept. 21, 1976

[54] VOLTAGE MAINTENANCE APPARATUS

[75] Inventor: John Alexander Copeland, III, Watchung, N.J.

[73] Assignee: Bell Telephone Laboratories, Incorporated, Murray Hill, N.J.

[22] Filed: Oct. 7, 1974

[21] Appl. No.: 512,849

[44] Published under the second Trial Voluntary Protest Program on February 3, 1976 as document No. B 512,849.

[52] U.S. Cl. ............................ 307/296; 307/238; 307/247 A
[51] Int. Cl.² .................................... H03K 1/02
[58] Field of Search ............... 307/238, 221 C, 296, 307/247 A

[56] References Cited
UNITED STATES PATENTS

| | | |
|---|---|---|
| 3,322,974 | 5/1967 | Ahrons et al. ................. 307/221 C |
| 3,597,629 | 8/1971 | Bartlett .............................. 307/238 |
| 3,636,530 | 1/1972 | Mark et al. ..................... 307/238 X |
| 3,870,905 | 3/1975 | Chikazawa ..................... 307/296 X |

Primary Examiner—John S. Heyman
Attorney, Agent, or Firm—R. B. Anderson; I. Ostroff

[57] ABSTRACT

A capacitor in parallel with a CMOS memory is used, in the event of a power outage, to apply a sufficient temporary voltage to the memory to maintain the stored data. Data storage retention time is maximized by a resistor, connected between the capacitor and the memory, having a resistance $R$ approximately given by $$R = 0.4 \, (V_i - V_f)/I_f \tag{1}$$

where $V_i$ is the initial voltage on the capacitor, $V_f$ is the minimum voltage for maintaining the data and $I_f$ is the capacitor discharge current at voltage $V_f$.

4 Claims, 4 Drawing Figures

VOLTAGE MAINTENANCE APPARATUS

BACKGROUND OF THE INVENTION

This invention relates to techniques for maintaining a minimum voltage value on a CMOS memory to maintain, in the event of a power outage, the data stored in the memory.

Repertory dialers are devices used in conjunction with telephone substations for storing a plurality of telephone numbers, each of which can be actuated, for example, by pressing a single pushbutton. Such apparatus must of course include some sort of a memory for storing the telephone number data, and appropriate apparatus for giving proper access. The memory may comprise a magnetic tape, but experience has shown that the mechanical apparatus needed for manipulating a tape lead to high maintenance costs.

Accordingly, attention has been directed to semiconductor integrated circuit memories, particularly MOS (for metal-oxide-semiconductor) memories. Such memories, which comprise an array of MOS flip-flop multivibrators, have become popular because of their relative ease of manufacture and consequent low cost. One drawback of conventional MOS memories is that each cell draws a significant amount of current in its quiescent condition. This can be particularly troublesome in repertory dialers because it is desirable to operate the entire substation apparatus from the central office d-c battery voltage available from the telephone subscriber lines.

Accordingly, investigation has been made of CMOS (for complementary-MOS) memories which have the known advantage requiring less power to maintain the stored data. Each memory cell, or multivibrator component, comprises both n-channel and p-channel MOS transistors, known as complementary transistors. As is known, with this arrangement, one reverse-biased transistor is included during all quiescent periods in each device current path, which considerably reduces the current flow needed for memory retention; typically the quiescent current is on the order of nanoamperes which compares with the microampere current required by conventional MOS multivibrators.

Telephone subscriber lines are unavoidably susceptible to the risk of power outage. Ordinarily, a temporary outage does not have any serious consequences, but if repertory dialers using semiconductor memories are included at the substations, the outage may result in the loss of data stored in the semiconductor memories.

Accordingly, it is known to use a capacitor in parallel with a memory for discharging, in the event of a power outage, a temporary current through the memory to maintain the stored data. While the low power requirements of CMOS memories have been made this temporary maintenance technique feasible, the maximum time such data can be retained has been about 0.8 days. Because serious disruptions sometimes cause power outages that last more than one day, it would be desirable to increase the time during which such data can be temporarily retained.

SUMMARY OF THE INVENTION

Accordingly, it is an object of this invention to increase the time during which a capacitor maintains the minimum voltage required for data storage in a CMOS memory.

I have found that a CMOS memory constitutes a nonlinear resistance with respect to discharge current from the capacitor. Because of this particular nonlinearity, I have found that the voltage maintenance time can be significantly increased by including a resistor in series with the capacitor and the CMOS memory. Although the resistor constitutes a voltage divider, and therefore reduces the voltage available from the capacitor to the memory, this voltage division is much more pronounced at the high initial voltage values than it is at the lower voltages nearer the minimum for maintaining the stored data. Because of the memory resistance nonlinearity, the linear resistor dramatically increases the time during which a voltage in excess of the minimum required voltage is applied across the CMOS memory in the event of a power outage. Data storage retention time is maximized by designing the resistor to have a resistance R approximately conforming to the relationship $$R = 0.4 \, (V_i - V_f)/I_f. \qquad (2)$$

These and other objects, features and advantages of the invention will be better understood from a consideration of the following detailed description taken in conjunction with the accompanying drawing.

DRAWING DESCRIPTION

DETAILED DESCRIPTION

Figure 1:
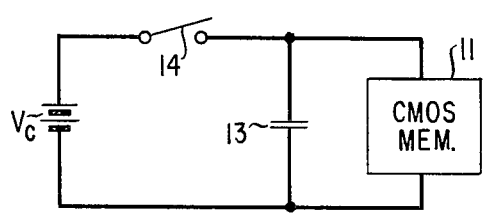
FIG. 1 is a schematic illustration of voltage retention apparatus of the prior art.

Referring now to FIG. 1, there is shown voltage maintenance apparatus of the prior art comprising a CMOS memory 11 powered by a voltage source 12. A capacitor 13 is charged by the voltage source 12 during normal operation so that, in the event of an accidental outage, as indicated schematically by the open circuit provided by switch 14, the capacitor would discharge through the memory 11, thereby temporarily maintaining a voltage across the memory to retain the stored data. Since CMOS memories each comprise multivibrator cells which transmit very little current, a 2,000 microfarad capacitor can maintain a minimum voltage in excess of 2 volts for 0.8 days.

Figure 2:
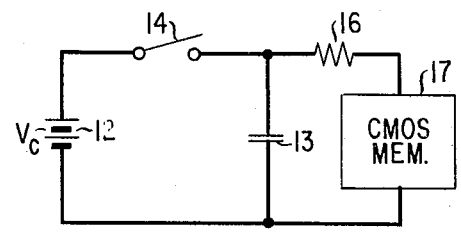
FIG. 2 is a schematic illustration of voltage retention apparatus with a resistor added in accordance with the invention.

In accordance with the invention, this voltage maintenance period is dramatically extended by the inclusion of a resistor 16 of FIG. 2 between capacitor 13 and memory 11. While a resistor increases the "RC time constant" of a capacitor arrangement, thereby increasing discharge time, it would not ordinarily be considered beneficial in a voltage maintenance circuit of the type shown in FIG. 1 because it also constitutes a voltage divider. That is, if R is large enough to significantly increase the discharge time, it would also reduce the voltage across CMOS memory 11 because of the voltage drop across the resistor.

It can be shown that if memory 11 were a linear resistive load, any added resistance would reduce, rather than increase, the time during which a minimum voltage $V_f$ can be maintained across the memory in the event of a power outage. The efficacy of resistor 16 results from a nonlinearity of the resistance of memory 11. Specifically, the resistance of memory 11 increases as the voltage across it drops; thus, as the voltage applied by capacitor 13 approaches the minimum voltage $V_f$, the proportion of voltage drop occurring across memory 11 increases. At lower voltages, where the effect of voltage division is important, very little proportional drop occurs across resistor 16. As a result, resistor 16 increases the voltage maintenance time from about 0.8 days to a typical value of 4 days; this can be further appreciated from the following considerations.

Due to the nonlinear resistance of commercially available CMOS memory arrays, it can be shown that current through the memory increases as an exponential function of voltage, rather than as a linear function. Specifically, current I through memory 11 can be shown to be substantially described by the expression $$I = I_o \exp (V/V_o) \qquad (3)$$

where $I_0$ is the initial current, $V$ is the voltage across the memory and $V_0$ is the initial voltage. With a 2048 bit memory made up of 32 64-bit integrated circuit packages, the value of $I_0$ for quiescent operation is 40 nanoamps and $V_0$ is 1.5 volts. The voltage maintenance time provided by the capacitor is given by $$T = CV_0 (I_f^{-1} - I_i^{-1}) \qquad (4)$$

where $C$ is the capacitance of capacitor 13, $I_f$ is the minimum current for maintaining the data (corresponding to $V_f$), and $I_i$ is the initial current just prior to the power outage. Letting $C = 2,000$ microfarads, $V_0 = 1.5$ volts, $I_f = 50$ nanoamps and $V_f = 2$ volts, the voltage maintenance time is about 17 hours.

With the resistor of FIG. 2, the voltage maintenance time is $$T = CV_0 (I_f^{-1} - I_i^{-1}) + RC (V_i - V_f)/V_0 \qquad (5)$$

where $V_i$ is the initial voltage across memory 11. Note that $$V_i = V_{ci} - I_i R \qquad (6)$$

where $R$ is the resistance of resistor 16, $V_{ci}$ is the initial voltage on capacitor 13 and $I_i$ is related to $V_i$ by Equation (2). $V_i$ and $I_i$ are found as a function of $R$ and $V_c$ by solving Equations (3) and (6) graphically or by computer.

The resistance R cannot be too large or too great a voltage drop (IR) will occur across the resistance and the critical memory voltage $V_f$ will be reached too quickly. On the other hand, if it is too small it will not provide any significant improvement over the circuit of FIG. 1.

Figure 3:
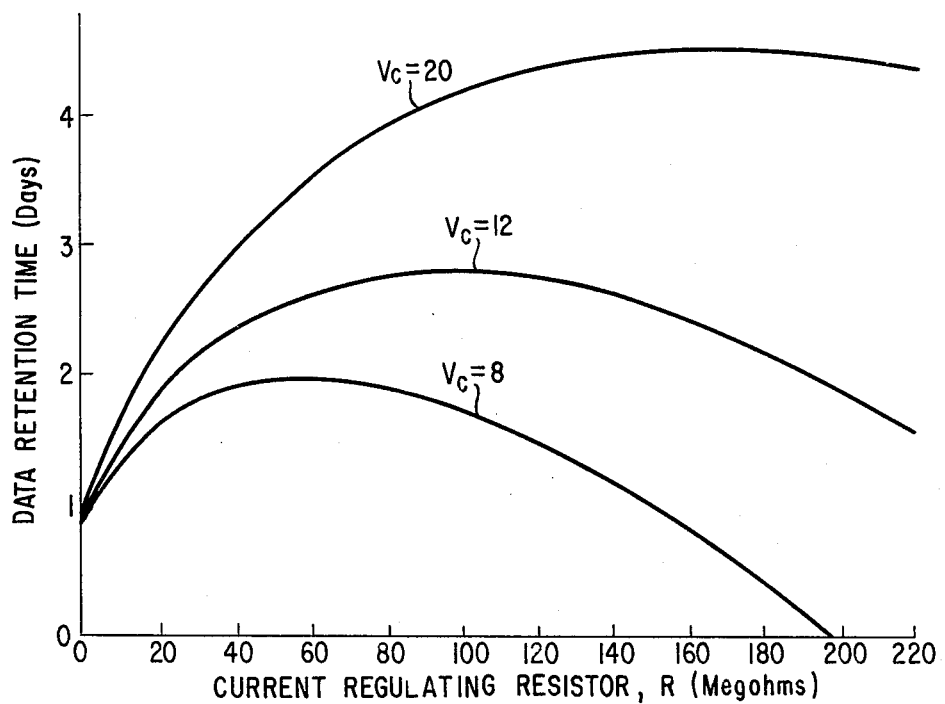
FIG. 3 is a graph of experimentally determined data taken from a circuit of the type shown in FIG. 2.

FIG. 3 is a graph of data retention time as a function of resistance R in megohms of the circuit of FIG. 2. It can be seen that with an initial capacitor voltage of 20 volts, the voltage retention time may significantly exceed 4 days. R is also a function of $I_0$, $V_0$ and $V_f$, which are taken as being those values mentioned above. It can be shown that the optimum value of R for giving maximum retention time, with $V_0$ in the range of 1.5 to 3 volts, is approximately given by the relation, $$R = 0.4 (V_{ci} - V_f) I_f \qquad (7)$$

Figure 4:
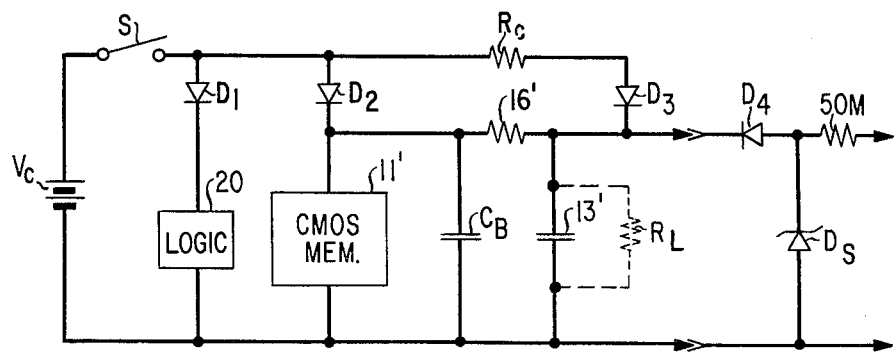
FIG. 4 is a schematic illustration of a repertory dialer incorporating the invention shown in FIG. 2.

FIG. 4 shows a complete practical circuit. When switch S closes the CMOS memory 11' is powered through diode $D_2$. The logic circuit 20 is powered through a similar diode $D_1$ to provide equal voltages on the logic and the memory. The storage capacitor 13' charges quickly through $R_c$ and diode $D_3$, since $R_c$, which prevents excessive current when S closes, has a much lower value than the resistor 16'. If $V_c$ is 10 volts, a value for $R_c$ of 10 kilohms will limit the surge, but will allow capacitor 13' to charge with a 2-second time constant if C is 2,000 microfarads. A bypass capacitor $C_B$ across the memory 11' is desirable because the resistance of this node is sufficiently high that even one picofarad of stray capacitance to an electrical noise source would couple signals with a frequency of 10 kilohertz or greater.

When switch S opens, or if there is an accidental outage, diodes $D_2$ and $D_3$ prevent capacitor 13' from discharging except through the CMOS memory 11' and through its internal leakage resistance, shown as $R_L$; $R_L$ is typically between 10 and 50 megohms. The effect of $R_L$ was not previously considered, but a simple calculation shows that the value R of resistor 16' should be reduced to a value only several times larger than $R_L$ if Equation (6) or an exact solution of Equation (5) indicate a higher optimum value where $R_L = \infty$. For example if $R_L = 10$ megohms then resistor 16' could have a value R of 30 megohms.

The additional charging circuit shown to the right of capacitor 13' can be used in telephone sets. When the handset is on-hook, switch S is open and 48 volts appears across the telephone line (tip and ring). A 50 megohm resistor is used to limit the current flow from the central-office 48 volt battery to less than 1 microampere which flows into capacitor 13'. If capacitor 13' charges to 10 volts, the zener diode $D_5$ shunts current to prevent overcharging. Diode $D_4$ prevents capacitor discharge from 13'. With this circuit, capacitor 13' never discharges unless central-office power fails or the phone is disconnected.

The foregoing has been presented to illustrate how advantage can be taken of the nonlinear current and resistance characteristics of a CMOS memory to increase the voltage maintenance time provided by an energy storage capacitor. If the impedance were roughly linear, the use of the resistor would be counterproductive. Further, through computation of the various parameters that control the discharge, I have described a resistor value for maximizing voltage retention time in accordance with the invention. The invention is particularly interesting in a design of repertory dialers, but could be used wherever temporary power outage to a CMOS memory may constitute a potential problem.

The term "CMOS memory" is one that is well understood in the art; and, for purposes of clarity and conciseness, the structure of such memories, their accessing, circuitry and the like, have not been detailed. CMOS memories are described, for example, in the paper "High Performance Low-Power CMOS Memories Using Silicon-on-Sapphire Technology," *I.E.E.E. J. Solid-State Circuits*, Vol. SC-7, pp. 135–145, Apr. 1972. While this particular paper describes the use of sapphire substrates, it is to be understood that the integrated circuit substrates normally used are silicon. The term "repertory dialer" is likewise considered to be one understood in the art.

The foregoing has been presented as an example of the inventive concept involved. Various other embodiments and modifications may be made by those skilled in the art without departing from the spirit and scope of the invention.

What is claimed is:

1. In combination:
   a semiconductor memory having a resistance-voltage characteristic which is similar to MOS memories;
   said memory being adapted to be connected in parallel with a d-c power supply for applying to the memory a voltage $V_i$;
   said memory being capable of storing electrical data provided the applied voltage is a minimum value $V_f$;
   means for temporarily maintaining an applied voltage between $V_f$ and $V_i$ in the event of accidental disconnection of the power supply comprising a capacitor in parallel with the memory and the power supply;
   and means for increasing the time during which the applied voltage can be temporarily maintained above $V_f$ comprising a resistor which is other than any internal resistance of the capacitor, connected between the capacitor and the memory, the resistor having a resistance R substantially defined by the Equation $R = 0.4 (V_{ci} - V_f)/I_f$ where $I_f$ is the capacitor discharge current at voltage $V_f$ and $V_{ci}$ is the initial voltage across the capacitor.

2. The combination of claim 1 wherein:
   the memory is a CMOS memory.

3. In combination:
   a CMOS memory;
   said memory being adapted to be connected in parallel with a power supply for applying to the memory a voltage $V_i$;
   said memory being capable of storing electrical data provided the applied voltage is a minimum value $V_f$;
   means for temporarily maintaining an applied voltage between $V_f$ and $V_i$ in the event of accidental disconnection of the power supply comprising a capacitor in parallel with the memory and the power supply;
   and means for increasing the time during which the applied voltage can be temporarily maintained above $V_f$ comprising a resistor, which is other than any inherent internal resistance of the capacitor, connected between the capacitor and the memory.

4. The combination of claim 3 wherein:
   the resistor has a resistance R substantially given by
   $R = 0.4 (V_{ci} - V_f)/I_f$
   where $I_f$ is the capacitor discharge current at voltage $V_f$, and $V_{ci}$ is the initial voltage across the capacitor.

* * * * *